(12) United States Patent
Sakai

(10) Patent No.: US 8,820,894 B2
(45) Date of Patent: Sep. 2, 2014

(54) LIQUID EJECTING HEAD, LIQUID EJECTING APPARATUS, PIEZOELECTRIC ELEMENT, AND METHOD FOR MANUFACTURING THE SAME

(71) Applicant: Seiko Epson Corporation, Tokyo (JP)

(72) Inventor: Tomohiro Sakai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/848,465

(22) Filed: Mar. 21, 2013

(65) Prior Publication Data

US 2013/0250006 A1 Sep. 26, 2013

(30) Foreign Application Priority Data

Mar. 26, 2012 (JP) ................................. 2012-070455

(51) Int. Cl.
*B41J 2/045* (2006.01)

(52) U.S. Cl.
USPC .......................................................... 347/68

(58) Field of Classification Search
None
See application file for complete search history.

(56) References Cited

U.S. PATENT DOCUMENTS

| 2007/0241642 A1 | 10/2007 | Miyazawa et al. |
| 2009/0230211 A1 | 9/2009 | Kobayashi et al. |
| 2011/0050811 A1* | 3/2011 | Wang .............................. 347/71 |
| 2011/0221833 A1* | 9/2011 | Yonemura et al. .............. 347/71 |

FOREIGN PATENT DOCUMENTS

| JP | 2001-223404 | 8/2001 |
| JP | 2007-287745 | 11/2007 |
| JP | 2009-242229 | 10/2009 |
| JP | 2009-252789 | 10/2009 |

* cited by examiner

*Primary Examiner* — Matthew Luu
*Assistant Examiner* — Erica Lin
(74) *Attorney, Agent, or Firm* — Workman Nydegger

(57) ABSTRACT

A liquid ejecting head is provided with a piezoelectric element having a piezoelectric layer and a first electrode and a second electrode provided on the piezoelectric layer, in which the piezoelectric layer contains a buffer layer provided on the first electrode and having a perovskite structure containing bismuth, iron, and at least one of zinc and nickel and a complex oxide layer provided on the buffer layer and having a perovskite structure containing bismuth, iron, barium, and titanium.

6 Claims, 14 Drawing Sheets

EXAMPLE 1

EXAMPLE 2

EXAMPLE 3

EXAMPLE 4

EXAMPLE 5

EXAMPLE 6

EXAMPLE 7

COMPARATIVE EXAMPLE 1

——— 150 micron

COMPARATIVE EXAMPLE 2

——— 150 micron

LIQUID EJECTING HEAD, LIQUID EJECTING APPARATUS, PIEZOELECTRIC ELEMENT, AND METHOD FOR MANUFACTURING THE SAME

The entire disclosure of Japanese Patent Application No. 2012-070455, filed Mar. 26, 2012, is incorporated by reference herein.

BACKGROUND

1. Technical Field

The present invention relates to a liquid ejecting head provided with a piezoelectric element having a piezoelectric layer containing a piezoelectric material and electrodes and ejects liquid droplets from nozzle openings, a liquid ejecting apparatus, a piezoelectric element, and a method for manufacturing the same.

2. Related Art

Mentioned as a typical example of the liquid ejecting head is, for example, an ink jet recording head in which a part of pressure generating chambers communicating with nozzles which eject ink droplets is constituted by a diaphragm, and the diaphragm is transformed by a piezoelectric element to pressurize ink in the pressure generating chambers, whereby the ink is ejected from the nozzle openings in the form of ink droplets. Mentioned as the piezoelectric element for use in the ink jet recording head is one in which a piezoelectric layer (piezoelectric film) containing a piezoelectric material which exhibits an electromechanical conversion function, e.g., a crystallized dielectric material, is placed between two electrodes.

The piezoelectric material used as the piezoelectric layer constituting such a piezoelectric element has been required to have high piezoelectric properties, and lead zirconate titanate (PZT) is mentioned as a typical example of the piezoelectric material (JP-A-2001-223404). However, a piezoelectric material in which lead is not contained or the lead content is reduced has been demanded from the viewpoint of environmental problems. Mentioned as piezoelectric materials not containing lead are $BiFeO_3$ piezoelectric materials containing Bi and Fe, for example (e.g., JP-A-2007-287745).

However, the piezoelectric layer containing such a $BiFeO_3$-based piezoelectric material has a problem such that cracking is likely to occur during manufacturing and after the passage of a predetermined time after manufacturing. Such a problem is not limited to the ink jet recording head. It is a matter of course that such a problem similarly arises in other liquid ejecting heads which eject liquid droplets other than ink and similarly arises in piezoelectric elements for use in substances other than liquid ejecting heads.

SUMMARY

An advantage of some aspects of the invention is to provide a liquid ejecting head having a piezoelectric layer which has a low environmental load and in which the occurrence of cracking is suppressed, a liquid ejecting apparatus, a piezoelectric element, and a method for manufacturing the same.

A first aspect of the invention which solves the above-described problems provides a liquid ejecting head provided with a piezoelectric element having a piezoelectric layer and a first electrode and a second electrode provided on the piezoelectric layer, in which the piezoelectric layer contains a buffer layer provided on the first electrode and having a perovskite structure containing bismuth, iron, and at least one of zinc and nickel and a complex oxide layer provided on the buffer layer and having a perovskite structure containing bismuth, iron, barium, and titanium.

According to such an aspect, by providing the piezoelectric layer having a laminated structure of the buffer layer having a perovskite structure containing bismuth, iron, and at least one of zinc and nickel and the complex oxide layer provided on the buffer layer and having a perovskite structure containing bismuth, iron, barium, and titanium, the liquid ejecting head having the piezoelectric layer in which the occurrence of cracking is suppressed can be provided. Moreover, since lead is not contained or the lead content can be reduced, the load to the environment can be reduced.

According to the aspect, it is preferable for the buffer layer to further contain titanium. Thus, the occurrence of cracking is further reduced.

A second aspect of the invention provides a liquid ejecting apparatus provided with the above-described liquid ejecting head.

Such an aspect can provide a liquid ejecting apparatus provided with a liquid ejecting head having a piezoelectric layer in which the load to the environment is reduced and the occurrence of cracking is suppressed.

A third aspect of the invention provides a piezoelectric element provided with a piezoelectric layer and a first electrode and a second electrode provided on the piezoelectric layer, in which the piezoelectric layer contains a buffer layer provided on the first electrode and having a perovskite structure containing bismuth, iron, and at least one of zinc and nickel and a complex oxide layer provided on the buffer layer and having a perovskite structure containing bismuth, iron, barium, and titanium.

Such an aspect can provide a piezoelectric element having a piezoelectric layer in which the load to the environment is reduced and the occurrence of cracking is suppressed.

A fourth aspect of the invention provides a method for manufacturing a piezoelectric element provided with a piezoelectric layer and a first electrode and a second electrode provided on the piezoelectric layer, and the method includes forming a buffer layer having a perovskite structure containing bismuth, iron, and at least one of zinc and nickel on the first electrode, and forming a complex oxide layer having a perovskite structure containing bismuth, iron, barium, and titanium on the buffer layer.

According to such an aspect, by providing the complex oxide layer having a perovskite structure containing bismuth, iron, barium, and titanium on the buffer layer having a perovskite structure containing bismuth, iron, and at least one of zinc and nickel to thereby form the piezoelectric layer, the piezoelectric element having the piezoelectric layer in which the occurrence of cracking is suppressed can be provided. Moreover, since lead is not contained or the lead content can be reduced, the load to the environment can be reduced.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiment 1

Figure 1:
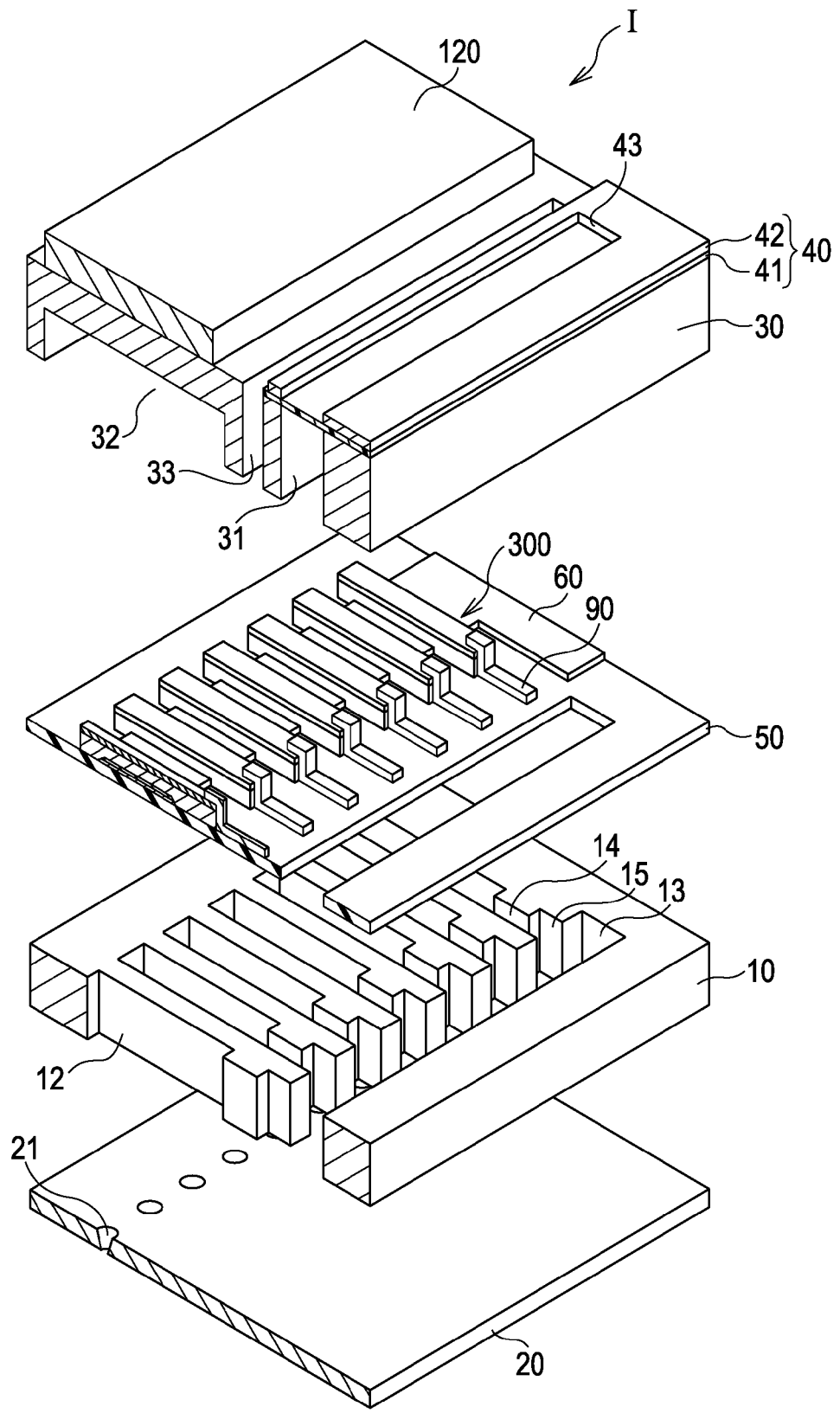
FIG. 1 is an exploded perspective view illustrating the schematic configuration of a recording head according to Embodiment 1.
Figure 2:
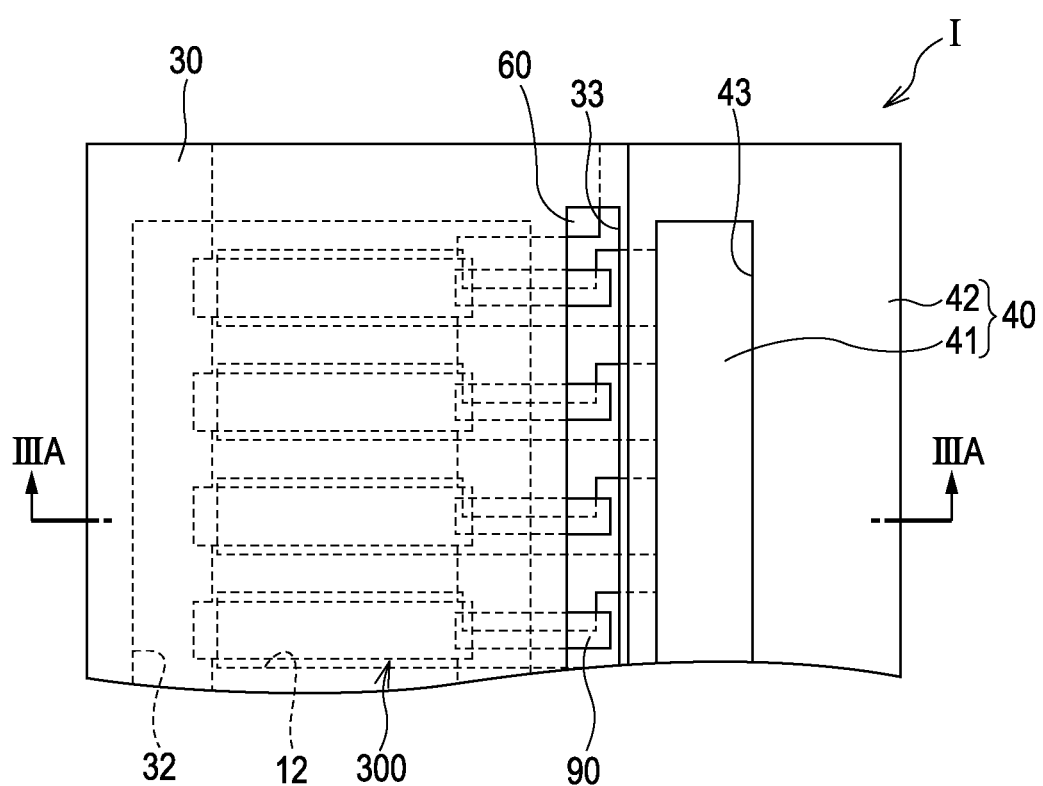
FIG. 2 is a plan view of the recording head according to Embodiment 1.
Figure 3A:
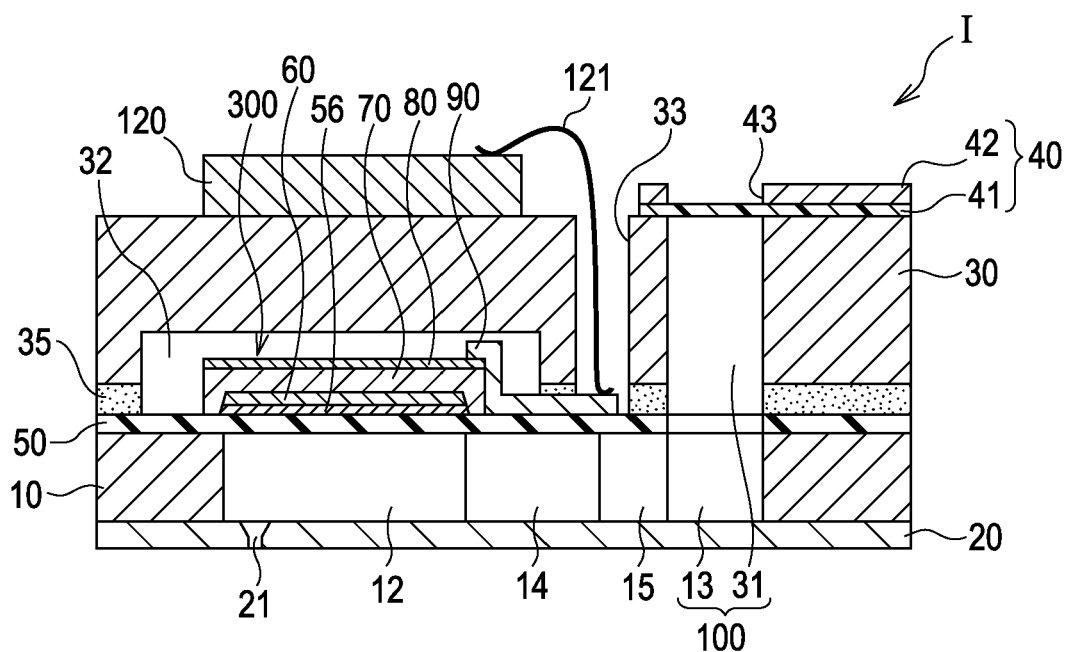
FIG. 3A is a cross sectional view of the recording head according to Embodiment 1.
Figure 3B:
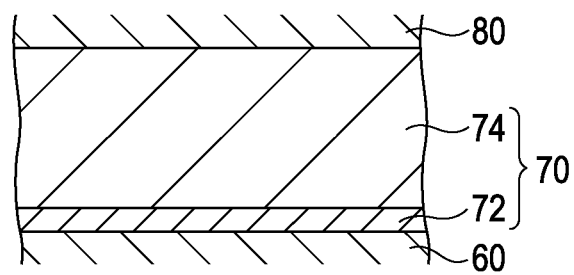
FIG. 3B is an enlarged cross sectional view of the principal portion of the recording head according to Embodiment 1.

FIG. 1 is an exploded perspective view illustrating the schematic configuration of an ink jet recording head which is an example of a liquid ejecting head manufactured by a manufacturing method according to Embodiment 1 of the invention. FIG. 2 is a plan view of FIG. 1. FIG. 3A is a cross sectional view along the IIIA-IIIA line of FIG. 2. FIG. 3B is an enlarged cross sectional view of the principal portion of FIG. 3A. As illustrated in FIGS. 1 to 3B, a flow path formation substrate 10 of this embodiment contains a silicon single crystal substrate, and an elastic film 50 containing silicon dioxide is formed on one surface thereof.

In the flow path formation substrate 10, a plurality of pressure generating chambers 12 are arranged in parallel in the width direction. Moreover, a communication portion 13 is formed in a region at the outside in the longitudinal direction of the pressure generating chambers 12 of the flow path formation substrate 10, so that the communication portion 13 and each pressure generating chamber 12 are made to communicate with each other through an ink supply path 14 and a communication path 15 provided for each pressure generating chamber 12. The communication portion 13 constitutes a part of a manifold which communicates with a manifold portion 31 of a protective substrate described later to serve as a common ink chamber of each pressure generating chamber 12. The ink supply paths 14 are formed with a width narrower than that of the pressure generating chambers 12 and maintain the flow path resistance of ink flowing into the pressure generating chambers 12 from the communication portion 13 at a fixed level. In this embodiment, the ink supply paths 14 are formed by reducing the width of the flow path from one side but the ink supply paths may be formed by reducing the width of the flow path from both sides. Or, the ink supply paths may be formed by not reducing the width of the flow path but reducing the thickness thereof. In this embodiment, the flow path formation substrate 10 is provided with liquid flow paths containing the pressure generating chambers 12, the communication portion 13, the ink supply paths 14, and the communication paths 15.

To an opening surface side of the flow path formation substrate 10, a nozzle plate 20 in which nozzle openings 21 are opened which communicate with the vicinity of the end portion at the side opposite to the ink supply path 14 of each pressure generating chamber 12 adheres with an adhesive, a thermal fusing film, or the like. The nozzle plate 20 contains, for example, glass ceramics, a silicon single crystal substrate, stainless steel, or the like.

On the other hand, the elastic film 50 is formed on the surface opposite to the opening surface of such a flow path formation substrate 10 as described above. On the elastic film 50, an adhesion layer 56 is provided which contains titanium oxide having a thickness of about 30 to 50 nm or the like, for example, and which increases the adhesiveness with the ground of first electrodes 60 of the elastic film 50 or the like. On the elastic film 50, an insulator film containing zirconium dioxide or the like may be provided as required.

Furthermore, on this adhesion layer 56, the first electrode 60 containing platinum (Pt), a piezoelectric layer 70 containing a buffer layer 72 having a perovskite structure containing bismuth, iron, and at least one of zinc and nickel and a complex oxide layer 74 described in detail later, and a second electrode 80 are laminated to constitute a piezoelectric element 300 as a pressure generating unit which causes changes in the pressure in the pressure generating chambers 12. Herein, the piezoelectric element 300 refers to a portion containing the first electrode 60, the piezoelectric layer 70, and the second electrode 80. In general, it is configured so that one electrode of the piezoelectric element 300 is used as a common electrode and the other electrode and the piezoelectric layer 70 are patterned every pressure generating chamber 12. In this embodiment, the first electrode 60 is used as the common electrode of the piezoelectric elements 300 and the second electrode 80 is used as an individual electrode of each of the piezoelectric elements 300. However, the configuration may be reversed depending on a drive circuit or wiring. Herein, the piezoelectric element 300 and a diaphragm which causes displacement by the drive of the piezoelectric element 300 are collectively referred to as an actuator. In the above-described example, although the elastic film 50, the adhesion layer 56, the first electrodes 60, and the insulator film provided as required act as the diaphragm. However, it is a matter of course that the invention is not limited thereto and the elastic film 50 and the adhesion layer 56 may not be provided, for example. It may be configured so that the piezoelectric element 300 itself substantially also serves as a diaphragm.

In this embodiment, the buffer layer 72 contains a complex oxide of a perovskite structure containing bismuth, iron, and at least one of zinc and nickel. The complex oxide of the perovskite structure containing bismuth, iron, and at least one of zinc and nickel is specifically a mixed crystal of bismuth ferrate and bismuth zincate or bismuth niccolate. Specifically, in the A site of the $ABO_3$ structure, 12 oxygen atoms are coordinated and, in the B site, 6 oxygen atoms are coordinated to form an octahedron. In the A site, Bi is located and, in the B site, Fe and Zn or Ni are located. Zn and Ni can be coexistent therein. Ti may be further present with Fe and Zn or Ni in the B site. The complex oxide may not be a mixed crystal of bismuth ferrate and bismuth zincate or bismuth niccolate and may be one in which a part of iron of bismuth ferrate is replaced by zinc or nickel.

Herein, the mixed crystal of bismuth ferrate and bismuth zincate or bismuth niccolate refers to one in which both the substances form a solid solution and the bismuth ferrate and the bismuth zincate or the bismuth niccolate are not solely detected in the X ray diffraction pattern. The bismuth ferrate is a known piezoelectric material, bismuth ferrate-based materials having various compositions are known. For example, in addition to bismuth ferrate, $BiFeO_3$, one is known in which one of the elements (Bi, Fe, and O) is not contained or is excessively contained or one in which one of the elements is replaced by other elements. When bismuth ferrate is indicated in the aspects of the invention, one whose composition deviates from the composition based on the stoichiometry ($BiFeO_3$) due to losing or excessively containing the elements (Bi, Fe, and O) is also included in the range of bismuth ferrate insofar as the fundamental properties are not changed.

When firing a plurality of complex oxide layers 74, the buffer layer 72 may cause diffusion of component elements or the like between the buffer layer 72 and the complex oxide layers 74 and may not be detected as a completely separated layer. However, it can be confirmed that there is a region where the concentration of zinc or nickel is high at the first electrode side of the piezoelectric layer 70, for example, and thus the presence of the buffer layer 72 can be confirmed.

The complex oxide layer 74 provided on such a buffer layer 72 is a piezoelectric material containing a complex oxide of a perovskite structure containing bismuth, iron, barium, and titanium. Specifically, a complex oxide having a perovskite structure containing a mixed crystal of a bismuth ferrate-based complex oxide and a bismuth titanate-based complex oxide is mentioned, for example. In the perovskite structure, i.e., $ABO_3$ structure, 12 oxygen atoms are coordinated in the A site of the structure and, in the B site thereof, 6 oxygen atoms are coordinated to form a octahedron. Bi and Ba are located in the A site and Fe and Ti are located in the B site. Mentioned as the bismuth ferrate-based complex oxide are bismuth ferrate ($BiFeO_3$), bismuth ferrate aluminate ($Bi(Fe, Al)O_3$), bismuth ferrate manganate ($Bi(Fe, Mn)O_3$), bismuth lanthanum ferrate manganate ($(Bi, La)(Fe, Mn)O_3$), bismuth barium ferrate manganate titanate ($(Bi, Ba)(Fe, Mn, Ti)O_3$), bismuth ferrate cobaltate ($Bi(Fe, Co)O_3$), bismuth cerium ferrate ($(Bi, Ce)FeO_3$), bismuth cerium ferrate manganate ($(Bi, Ce)(Fe, Mn)O_3$), bismuth lanthanum cerium ferrate ($(Bi, La, Ce)FeO_3$), bismuth lanthanum cerium ferrate manganate ($(Bi, La, Ce)(Fe, Mn)O_3$), bismuth samarium ferrate ($(Bi, Sm)FeO_3$), bismuth ferrate chromate ($Bi(Cr, Fe)O_3$), bismuth potassium ferrate manganate titanate ($(Bi, K)(Fe, Mn, Ti)O_3$), and bismuth barium ferrate manganate zincate titanate ($(Bi, Ba)(Fe, Mn, Zn, Ti)O_3$). Mentioned as the bismuth titanate-based complex oxide are bismuth sodium potassium titanate ($(Bi, Na, K)TiO_3$), bismuth barium sodium titanate zincate ($(Bi, Na, Ba)(Zn, Ti)O_3$), and bismuth barium sodium titanate cuprate ($(Bi, Na, Ba)(Cu, Ti)O_3$). In addition thereto, those obtained by adding bismuth potassium titanate ($(Bi, K)TiO_3$), bismuth chromate ($BiCrO_3$), and the like are mentioned. $Bi(Zn_{1/2}Ti_{1/2})O_3$, $(Bi_{1/2}K_{1/2})TiO_3$, $(Bi_{1/2}Na_{1/2})TiO_3$, or $((Li, Na, K)(Ta, Nb)O_3)$ to the complex oxides mentioned above may be acceptable. In this embodiment, the complex oxide layer 74 is a complex oxide containing Bi, Fe, Ba, and Ti and having a perovskite structure.

The complex oxide containing Bi, Fe, Ba, and Ti and having a perovskite structure is represented as a complex oxide having a perovskite structure of a mixed crystal of bismuth ferrate and barium titanate or a solid solution in which bismuth ferrate and barium titanate form a uniform solid solution. In the X ray diffraction pattern, bismuth ferrate and barium titanate are not solely detected. Herein, bismuth ferrate and barium titanate each are known piezoelectric materials having the perovskite structure and bismuth ferrate materials and barium titanate materials having various compositions are known. For example, known as bismuth ferrate and barium titanate are, in addition to $BiFeO_3$ and $BaTiO_3$, one in which one of the elements (Bi, Fe, Ba, Ti, and O) is not contained or is excessively contained or one in which one of the elements is replaced by other elements. When bismuth ferrate and barium titanate are indicated in the aspects of the invention, one whose composition deviates from the composition based on the stoichiometry due to losing or excessively containing elements and one in which one of the elements is replaced by other elements are also included in the range of bismuth ferrate and barium titanate insofar as the fundamental properties are not changed. The ratio of the bismuth ferrate and the barium titanate can also be variously changed.

The composition of the complex oxide layer 74 containing the complex oxide containing Bi, Fe, Ba, and Ti and having the perovskite structure is expressed as a mixed crystal represented by the following expression (1), for example. Expression (1) can also be represented by the following expression (1'). Herein, Expressions (1) and (1') represent the composition based on the stoichiometry. As described above, insofar as the perovskite structure can be contained, not only inevitable changes in the composition due to lattice mismatch, oxygen deficiency, and the like but partial replacement of the elements and the like are permitted. For example, when the stoichiometric ratio is 1, changes within 0.85 to 1.20 are permitted. Even when substances are different from each other when represented by expressions as follows, substances having the same ratio of the elements in the A site and the elements in the B site are sometimes considered to be the same complex oxide.

$$(1-x)[BiFeO_3]-x[BaTiO_3]$$

$$(0<x<0.40) \quad (1)$$

$$(Bi_{1-x}Ba_x)(Fe_{1-x}Ti_x)O_3$$

$$(0<x<0.40) \quad (1')$$

When the complex oxide constituting the complex oxide layer 74 contains Bi, Fe, Ba, and Ti, the complex oxide may further contain elements other than Bi, Fe, Ba, and Ti. As other elements, Mn, Co, Cr, and the like are mentioned, for example. It is a matter of course that, also in the case of a complex oxide containing other elements, it is necessary to have a perovskite structure. When the complex oxide layer 74 contains Mn, Co, and Cr, the complex oxide has a structure in which Mn, Co, and Cr are located in the B site. For example, when Mn is contained, the complex oxide constituting the complex oxide layer 74 is expressed as a complex oxide having a structure in which a part of Fe of a solid solution in which bismuth ferrate and barium titanate form a uniform solid solution or having a perovskite structure of a mixed crystal of bismuth ferrate manganate and barium titanate. It is found that the fundamental properties are the same as those of the complex oxide having a perovskite structure of a mixed crystal of bismuth ferrate and barium titanate but the leak properties improve. Also when Co and Cr are contained, the leak properties improve similarly as in the case of containing Mn. In the X ray diffraction pattern, bismuth ferrate, barium titanate, bismuth ferrate manganate, bismuth cobalt ferrate, and bismuth ferrate chromate are not solely detected. The description is given taking Mn, Co, and Cr as an example but it is found that the leak properties similarly improve also when two elements of other transition metal elements are simultaneously contained and the elements can be formed into the piezoelectric layer 70. Furthermore, other known additives may also be contained in order to improve the properties.

The complex oxide layer 74 containing such a complex oxide containing Mn, Co, and Cr in addition to Bi, Fe, Ba, and Ti and having a perovskite structure is a mixed crystal represented by the following expression (2), for example. Expression (2) can also be represented by the following expression (2'). In Expressions (2) and (2'), M represents Mn, Co, or Cr. Herein, Expressions (2) and (2') represent the composition based on the stoichiometry. As described above, insofar as the perovskite structure can be contained, inevitable changes in the composition due to lattice mismatch, oxygen deficiency, and the like are permitted. For example, when the stoichiometric ratio is 1, changes within 0.85 to 1.20 are permitted. Even when substances are different from each other when represented by expressions as follows, substances having the same ratio of the elements in the A site and the elements in the B site are sometimes considered to be the same complex oxide.

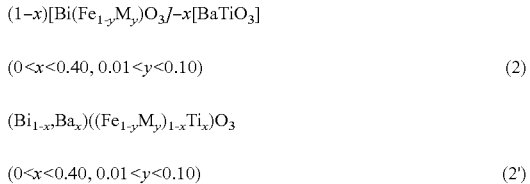

The thickness of the buffer layer 72 and the complex oxide layer 74 is not limited. For example, the thickness of the buffer layer 72 is 10 nm to 200 nm. The thickness of the complex oxide layer 74 is, for example, 3 µm or lower and preferably 0.3 to 1.5 µm.

To each of the second electrodes 80 which are individual electrodes of such piezoelectric elements 300, a lead electrode 90 is connected which contains, for example, gold (Au) or the like and is drawn out from the vicinity of the end portion at the side of the ink supply path 14 to be extended to the elastic film 50 and the insulator film to be provided as required.

Onto the flow path formation substrate 10 on which such piezoelectric elements 300 are formed, i.e., on the first electrode 60, the elastic film 50, and the insulator film to be provided as required, and the lead electrode 90, a protective substrate 30 having a manifold portion 31 constituting at least one part of a manifold 100 is bonded through an adhesive 35. In this embodiment, the manifold portion 31 is formed penetrating the protective substrate 30 in the thickness direction over the width direction of the pressure generating chambers 12 and is made to communicate with the communication portion 13 of the flow path formation substrate 10 to constitute the manifold 100 which serves as a common ink chamber of the respective pressure generating chamber 12 as described above. The communication portion 13 of the flow path formation substrate 10 may be divided into a plurality of parts for each pressure generating chamber 12, so that only the manifold portion 31 may be used as a manifold. Furthermore, for example, only the pressure generating chambers 12 may be provided in the flow path formation substrate 10, and the ink supply paths 14 communicating with the manifold 100 and each pressure generating chamber 12 may be provided in a member (e.g., the elastic film 50, the insulator film to be provided as required, and the like) interposed between the flow path formation substrate 10 and the protective substrate 30.

In a region facing the piezoelectric element 300 of the protective substrate 30, a piezoelectric element holding portion 32 is provided which has a space large enough not to inhibit the movement of the piezoelectric element 300. The piezoelectric element holding portion 32 may have a space large enough not to inhibit the movement of the piezoelectric element 300, and the space may be or may not be sealed.

As such a protective substrate 30, materials having substantially the same coefficient of thermal expansion as that of the flow path formation substrate 10, e.g., glass and ceramic materials, are preferably used. In this embodiment, a silicon single crystal substrate which is the same material as that of the flow path formation substrate 10 is used for the formation thereof.

The protective substrate 30 is provided with a through hole 33 penetrating the protective substrate 30 in the thickness direction. The vicinity of the end portion of the lead electrode 90 drawn out from each piezoelectric element 300 is provided in such a manner as to be exposed to the inside of the through hole 33.

Onto the protective substrate 30, a drive circuit 120 for driving the piezoelectric elements 300 arranged in parallel is fixed. As the drive circuit 120, a circuit substrate, a semiconductor integrated circuit (IC), or the like can be used, for example. The drive circuit 120 and the lead electrode 90 are electrically connected through a connection wiring 121 containing an electrically conductive wire, such as a bonding wire.

Onto such a protective substrate 30, a compliance substrate 40 containing a sealing film 41 and a fixation plate 42 is bonded. Herein, the sealing film 41 contains a material having a low rigidity and flexibility, and the sealing film 41 seals one surface of the manifold portion 31. The fixation plate 42 is formed with a relatively hard material. A region facing the manifold 100 of the fixation plate 42 is completely removed in the thickness direction to form an opening portion 43, and therefore one surface of the manifold 100 is sealed only by the sealing film 41 having flexibility.

In such an ink jet recording head I of this embodiment, ink is taken in from an ink introduction port connected to an ink supply unit (not illustrated) at the outside, the inside of a space from the manifold 100 to the nozzle opening 21 is filled with the ink, and thereafter a voltage is applied between the first electrode 60 and the second electrode 80 corresponding to each of the pressure generating chambers 12 in accordance with a recording signal from the drive circuit 120 to bend and transform the elastic film 50, the adhesion layer 56, the first electrode 60, and the piezoelectric layer 70, so that the pressure in each pressure generating chamber 12 increases, whereby ink droplets are discharged from the nozzle openings 21.

Next, an example of a method for manufacturing the ink jet recording head of this embodiment is described with reference to FIGS. 4A to 8B. FIGS. 4A to 8B are cross sectional views in the longitudinal direction of the pressure generating chamber.

Figure 4A:
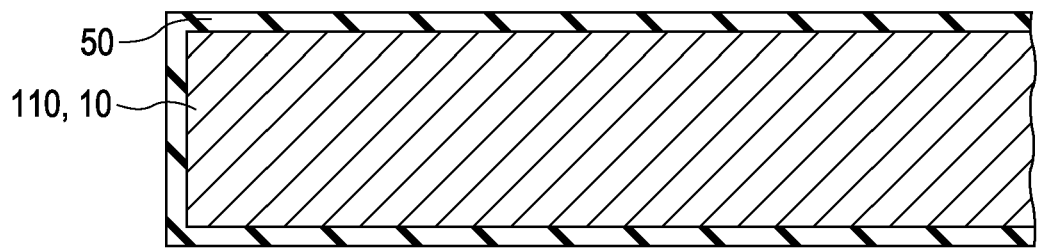
FIGS. 4A and 4B are cross sectional views illustrating manufacturing processes of the recording head according to Embodiment 1.
Figure 4B:
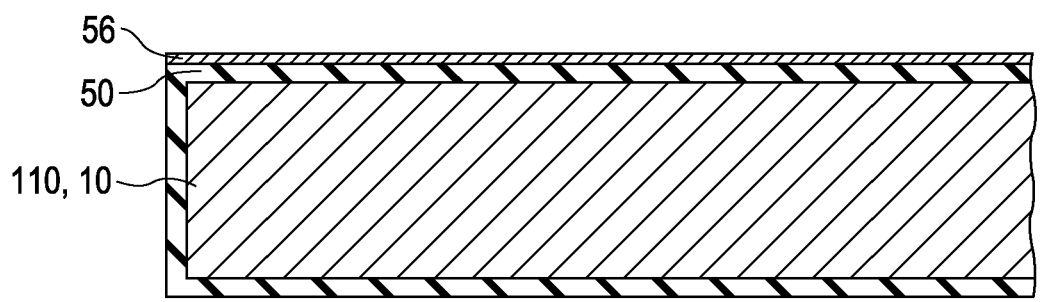

First, as illustrated in FIG. 4A, a silicon dioxide film containing silicon dioxide ($SiO_2$) or the like constituting the elastic film 50 is formed by thermal oxidation or the like on the surface of a flow path formation substrate wafer 110 which is a silicon wafer. Subsequently, as illustrated in FIG. 4B, the adhesion layer 56 is formed on the elastic film 50 (silicon dioxide film) by sputtering, thermal oxidation, or the like.

Figure 5A:
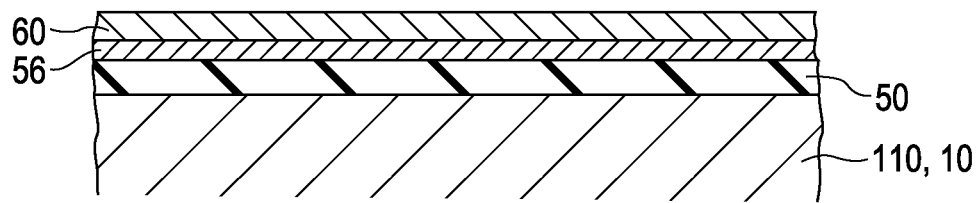
FIGS. 5A to 5D are cross sectional views illustrating manufacturing processes of the recording head according to Embodiment 1.

Next, as illustrated in FIG. 5A, the first electrode 60 containing platinum is formed on the adhesion layer 56 by a sputtering method, a vapor deposition method, or the like.

Figure 5B:
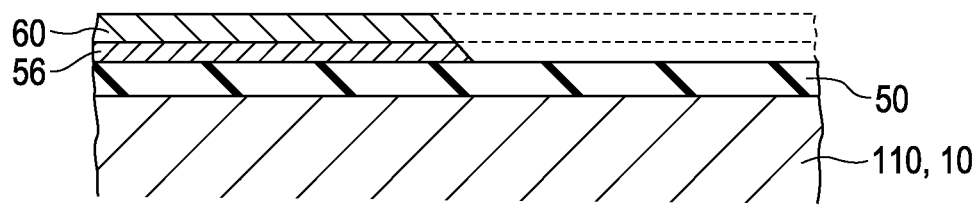

Next, as illustrated in FIG. 5B, the adhesion layer 56 and the first electrode 60 are simultaneously patterned using a resist of a predetermined shape (not illustrated) as a mask on the first electrode 60 in such a manner that the side surfaces of the adhesion layer 56 and the first electrode 60 incline.

Subsequently, after separating the resist, a buffer layer precursor film 71 containing a precursor of a mixed crystal of bismuth ferrate and bismuth zincate or bismuth niccolate is formed on the first electrode 60. The buffer layer precursor film 71 can be manufactured using chemical solution methods, such as a Metal-Organic Decomposition (MOD) method and a sol-gel method, in which a solution containing a metal complex is applied, dried, and further fired at a high temperature, thereby obtaining the buffer layer 72 containing a metal oxide. In addition thereto, the buffer layer 72 can also be manufactured by a laser ablation method, a sputtering method, a pulsed laser deposition method (PLD method), a CVD method, an aerosol deposition method, and the like.

Figure 5C:
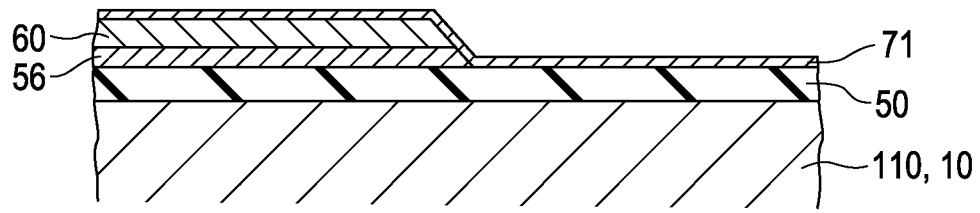

As a specific example of a formation procedure in the case of forming the buffer layer 72 by the chemical solution method, first, a buffer layer formation composition (precursor solution of the buffer layer) containing an MOD solution or a sol containing metal complexes, specifically metal complexes containing Bi and Mn and, as required, Fe and the like, is applied onto the first electrode 60 containing Pt using a spin coating method or the like to thereby form a buffer layer precursor film 71 as illustrated in FIG. 5C (buffer layer precursor solution application process).

The precursor solution of the buffer layer 72 to apply is one obtained by mixing metal complexes capable of forming the complex oxide of the mixed crystal of bismuth ferrate and bismuth zincate or bismuth niccolate by firing, and dissolving or dispersing the mixture in organic solvents. As the metal complexes containing each of Bi and Fe, Co, Na, Mg, and the like, alkoxides, organic acid salts, β diketone complexes, and the like can be used, for example. As the metal complexes containing Bi, bismuth 2-ethylhexanoate, bismuth acetate, and the like are mentioned, for example. As the metal complexes containing Fe, iron 2-ethylhexanoate, iron acetate, iron tris(acetylacetonato), and the like are mentioned, for example. As the metal complexes containing Zn, zinc 2-ethylhexanoate, zinc acetate, and the like are mentioned, for example. As the metal complexes containing Ni, nickel 2-ethylhexanoate, nickel acetate, and the like are mentioned, for example. It is a matter of course that metal complexes containing two or more elements of Bi and Fe, Zn, Ni, and the like may be used. Mentioned as the solvent of the precursor solution of the buffer layer are propanol, butanol, pentanol, hexanol, octanol, ethylene glycol, propylene glycol, octane, decane, cyclohexane, xylene, toluene, tetrahydrofurane, acetic acid, octylic acid, and the like.

Thus, in order to form the buffer layer 72 containing the mixed crystal of bismuth ferrate and bismuth zincate or bismuth niccolate, a precursor solution containing a metal complex of Bi, Fe, Zn, and Ni may be applied onto the first electrode 60 containing Pt, and then fired, for example. The composition of the raw materials of the precursor solution and the like are not particularly limited, and the raw materials may be mixed in such a manner that each metal achieves a desired molar ratio.

Subsequently, the buffer layer precursor film 71 is heated to a predetermined temperature (e.g., 150 to 200° C.), and then dried for a given period of time (buffer layer drying process). Next, the dried piezoelectric precursor film 71 is heated to a predetermined temperature (e.g., 350 to 450° C.), and then held for a given period of time for degreasing (buffer layer degreasing process). The degreasing as used herein is to remove the organic components contained in the piezoelectric precursor film 71 as $NO_2$, $CO_2$, $H_2O$, and the like, for example. The atmosphere of the buffer layer drying process and the buffer layer degreasing process is not limited, and the processes may be performed in the atmosphere, oxygen environment, or inactive gas.

Figure 5D:
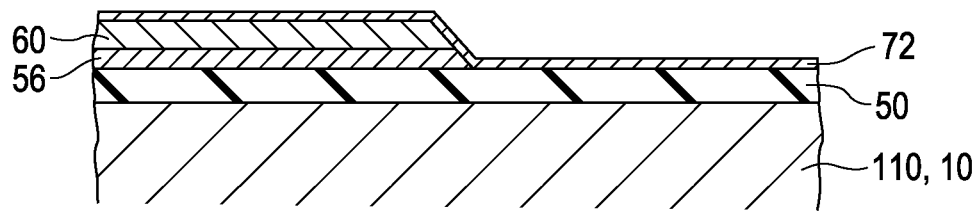

Next, as illustrated in FIG. 5D, the buffer layer precursor film 71 is heated to a predetermined temperature, e.g., about 600 to 850° C., and then held for a given period of time, e.g., 1 to 10 minutes, for crystallization, thereby forming the buffer layer 72 containing the mixed crystal of bismuth ferrate and bismuth zincate or bismuth niccolate (firing process).

Also in this firing process, the atmosphere is not limited and the firing process may be performed in the atmosphere, oxygen environment, or inactive gas. As a heating device for use in the buffer layer drying process, the buffer layer degreasing process, and the buffer layer firing process, a Rapid Thermal Annealing (RTA) device which heats by irradiation with an infrared lamp, a hot plate, and the like are mentioned, for example.

In this embodiment, although the buffer layer 72 containing one layer was formed by performing the application process once, a buffer layer 72 containing a plurality of layers may be formed by repeating, two or more times, the sequence of operations of the buffer layer application process, the buffer layer drying process, and the buffer layer degreasing process or the sequence of operations of the buffer layer application process, the buffer layer drying process, the buffer layer degreasing process, and the buffer layer firing process in accordance with a desired film thickness and the like.

Next, the complex oxide layer 74 containing a complex oxide containing Bi, Fe, Ba, and Ti is formed on the buffer layer 72. The complex oxide layer 74 can be manufactured by applying a solution containing a metal complex, drying, and then degreasing, for example. The complex oxide layer 74 can also be manufactured by a laser ablation method, a sputtering method, a pulsed laser deposition method (PLD method), a CVD method, an aerosol deposition method, and the like.

Figure 6A:
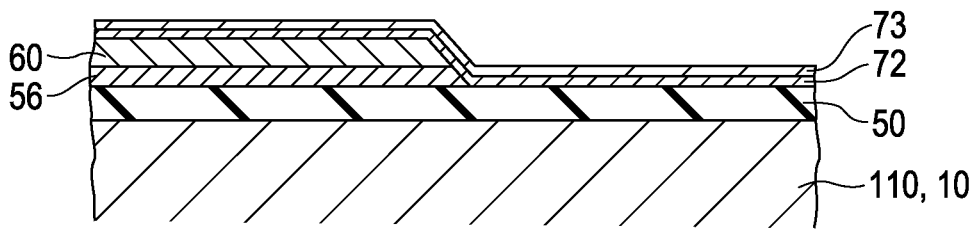
FIGS. 6A to 6C are cross sectional views illustrating manufacturing processes of the recording head according to Embodiment 1.

As a specific example of a formation procedure in the case of forming the complex oxide layer 74 by the chemical solution method, first, a complex oxide layer formation composition (precursor solution) containing an MOD solution or a sol containing metal complexes, specifically metal complexes containing Bi, Fe, Ba, and Ti, is applied onto the buffer layer 72 using a spin coating method or the like to thereby form a complex oxide layer precursor film (piezoelectric layer precursor film) 73 as illustrated in FIG. 6A (application process).

The precursor solution to apply is one obtained by mixing metal complexes capable of forming complex oxides containing Bi, Fe, Ba, and Ti by firing, and dissolving or dispersing the mixture in organic solvents. When forming the complex oxide layer 74 containing complex oxides containing Mn, Co, and Cr, a precursor solution further containing metal complexes containing Mn, Co, and Cr is used. The mixing ratios of the metal complexes containing each of Bi and Fe, Ba, Ti, Mn, Co, and Cr may be determined in such a manner that each metal achieves a desired molar ratio. As the metal complexes containing each of Bi, Fe, Ba, Ti, Mn, Co, and Cr, alkoxides, organic acid salts, β diketone complexes, and the like can be used, for example. As the metal complexes containing Bi, bismuth 2-ethylhexanoate, bismuth acetate, and the like are mentioned, for example. As the metal complexes containing Fe, iron 2-ethylhexanoate, iron acetate, iron tris(acetylacetonato), and the like are mentioned, for example. As the metal complexes containing Ba, barium isopropoxide, barium 2-ethylhexanoate, barium acetylacetonato, and the like are mentioned, for example. As the metal complexes containing Ti, titanium isopropoxide, titanium 2-ethyl hexanoate, titanium(di-i-propoxide)bis(acetylacetonato), and the like are mentioned, for example. As the metal complexes containing Mn, manganese 2-ethylhexanoate, manganese acetate, and the like are mentioned, for example. As organometallic compounds containing Co, cobalt 2-ethylhexanoate, cobalt (III) acetylacetonato, and the like are mentioned, for example. As organometallic compounds containing Cr, chromium 2-ethyl hexanoate and the like are mentioned. It is a matter of course that metal complexes containing two or more elements of Bi and Fe, Ba, Ti, Mn, Co, and Cr may be used. Mentioned as the solvent of the precursor solution are propanol, butanol, pentanol, hexanol, octanol, ethylene glycol, propylene glycol, octane, decane, cyclohexane, xylene, toluene, tetrahydrofurane, acetic acid, octylic acid, and the like.

Subsequently, the complex oxide layer precursor film 73 is heated to a predetermined temperature (e.g., 150 to 200° C.), and then dried for a given period of time (drying process). Next, the dried complex oxide layer precursor film 73 is heated to a predetermined temperature (e.g., 350 to 450° C.), and then held for a given period of time for degreasing (degreasing process). The degreasing as used herein is to remove the organic components contained in the complex oxide layer precursor film 73 as $NO_2$, $CO_2$, $H_2O$, and the like, for example. The atmosphere of the drying process and the degreasing process is not limited, and the processes may be performed in the atmosphere, oxygen environment, or inactive gas. The application process, the drying process, and the degreasing process may be performed two or more times.

Figure 6B:
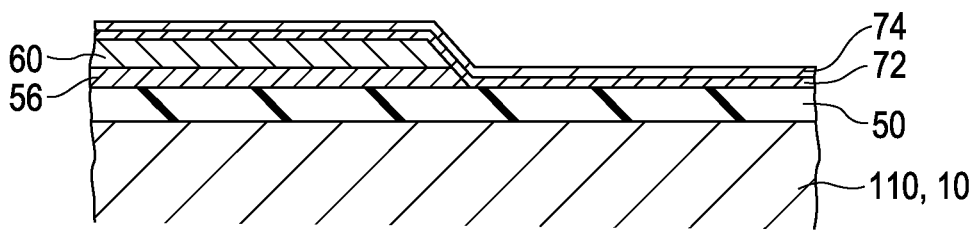

Next, as illustrated in FIG. 6B, the complex oxide layer precursor film 73 is heated to a predetermined temperature, e.g., about 600 to 850° C., and then held for a given period of time, e.g., 1 to 10 minutes, for firing (firing process). Thus, the film is crystallized to thereby form a complex oxide layer 77 containing a complex oxide containing Bi, Fe, Ba, and Ti and having a perovskite structure. Also in this firing process, the atmosphere is not limited and the firing process may be performed in the atmosphere, oxygen environment, or inactive gas. As a heating device for use in the drying process, the degreasing process, and the firing process, a Rapid Thermal Annealing (RTA) device which heats by irradiation with an infrared lamp, a hot plate, and the like are mentioned, for example.

Figure 6C:
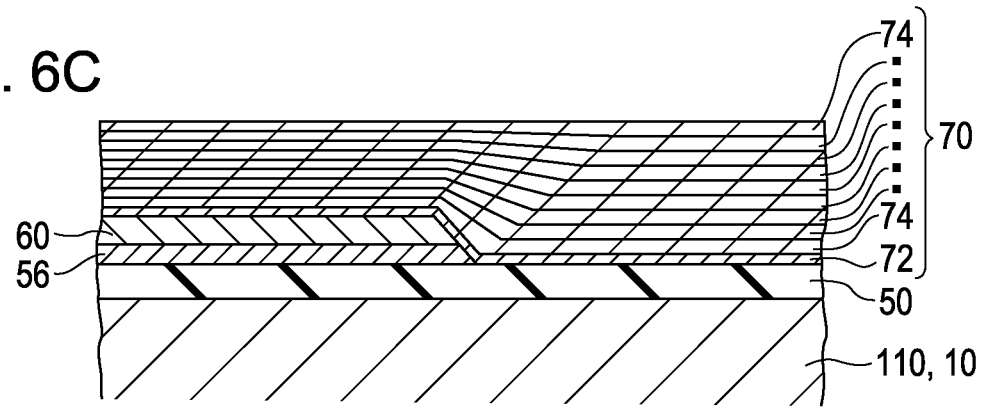

Subsequently, the application process, the drying process, and the degreasing process described above or the application process, the drying process, the degreasing process, and the firing process described above are repeated two or more times in accordance with a desired film thickness to thereby form a plurality of the complex oxide layers 74, thereby forming the piezoelectric layer 70 having a predetermined thickness containing the buffer layer 72 and the plurality of the complex oxide layers 74 as illustrated in FIG. 6C. For example, when the film thickness per application of the application solution is about 0.1 μm, the film thickness of the entire piezoelectric layer 70 containing one layer of the buffer layer 72 and 10 layers of the complex oxide layers 74 is about 1.1 μm. In this embodiment, the complex oxide layers 74 are laminated, but only one complex oxide layer 74 may be acceptable.

Thus, when the buffer layer 72 containing the mixed crystal of bismuth ferrate and bismuth zincate or bismuth niccolate is formed, the occurrence of cracking can be remarkably suppressed as compared with the case where a layer containing a piezoelectric material containing Bi, Fe, Ba, and Ti (the complex oxide layer 74 in this embodiment) to be formed thereon is not formed on the buffer layer. This is assumed to be because the crystal growth of the perovskite structure of the complex oxide layer 74 to be formed thereon is promoted by the buffer layer 72.

Figure 7A:
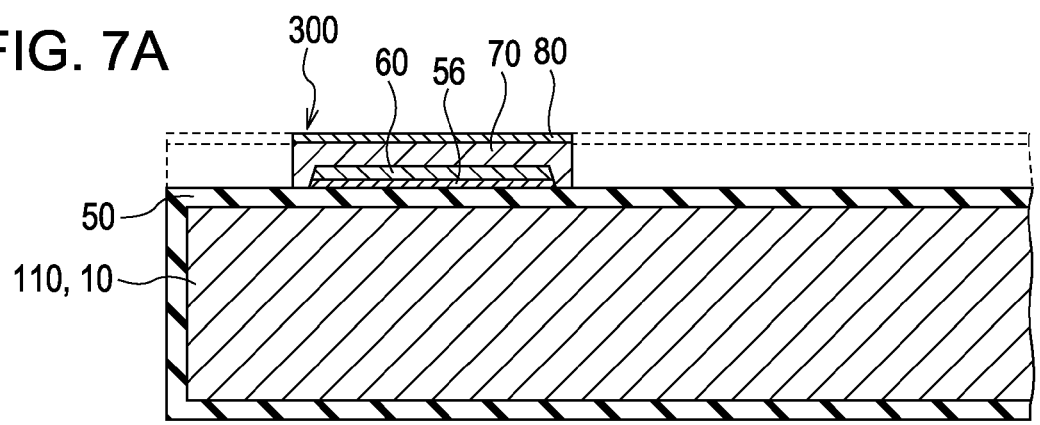
FIGS. 7A to 7C are cross sectional views illustrating manufacturing processes of the recording head according to Embodiment 1.

After forming the piezoelectric layer 70, the second electrode 80 containing platinum or the like is formed on the piezoelectric layer 70 by a sputtering method or the like, and then the piezoelectric layer 70 and the second electrode 80 are simultaneously patterned in a region facing each pressure generating chamber 12 to thereby form the piezoelectric element 300 containing the first electrode 60, the piezoelectric layer 70, and the second electrode 80 as illustrated in FIG. 7A. In the patterning of the piezoelectric layer 70 and the second electrode 80, the patterning can be collectively carried out by dry etching the same through a resist (not illustrated) formed into a predetermined shape. Thereafter, annealing may be performed as required in a temperature range of 600 to 850° C., for example.

Figure 7B:
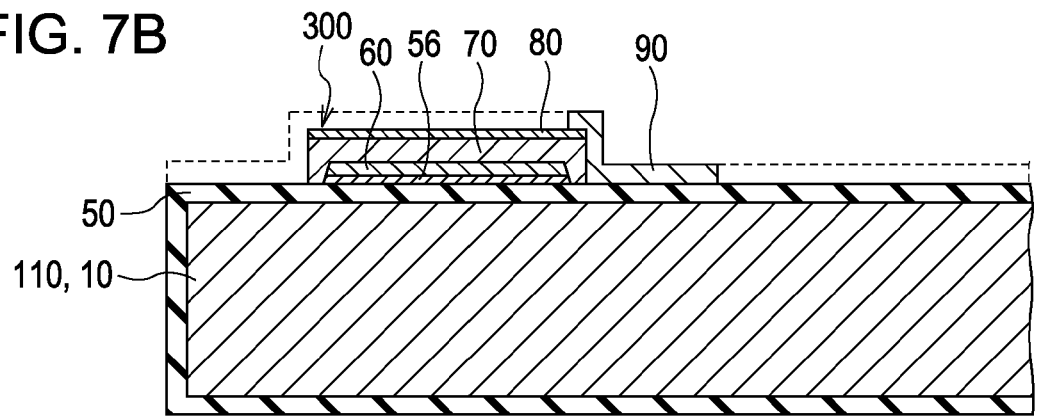

Next, as illustrated in FIG. 7B, the lead electrode 90 containing, for example, gold (Au) or the like is formed on the entire surface of the flow path formation substrate wafer 110, and then patterned for each piezoelectric element 300 through a mask pattern (not illustrated) containing a resist or the like.

Figure 7C:
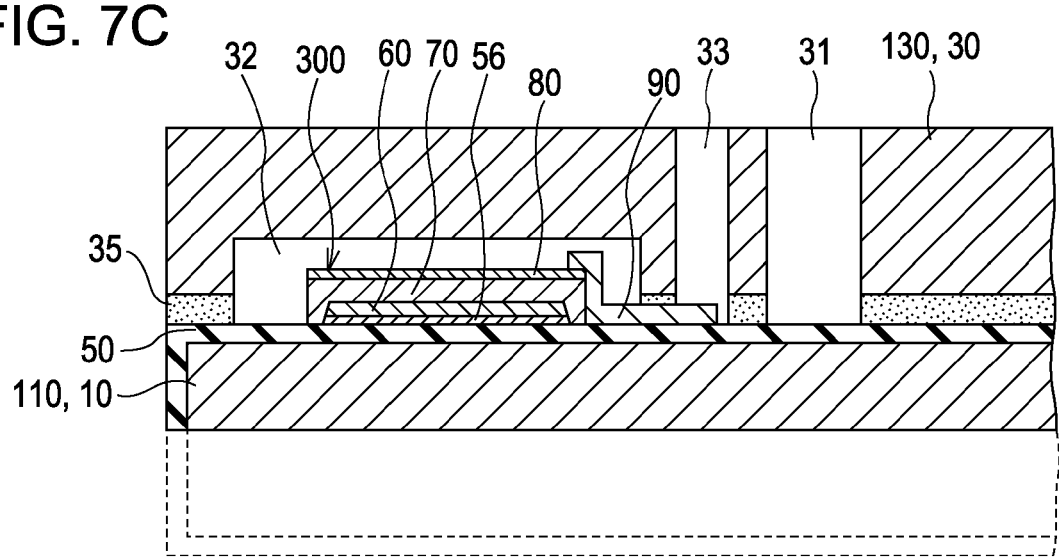

Next, as illustrated in FIG. 7C, a protective substrate wafer 130 which is a silicon wafer and serves as a plurality of the protective substrates 30 is formed at the piezoelectric element 300 side of the flow path formation substrate wafer 110 through the adhesive 35, and then the thickness of the flow path formation substrate wafer 110 is reduced to a predetermined thickness.

Figure 8A:
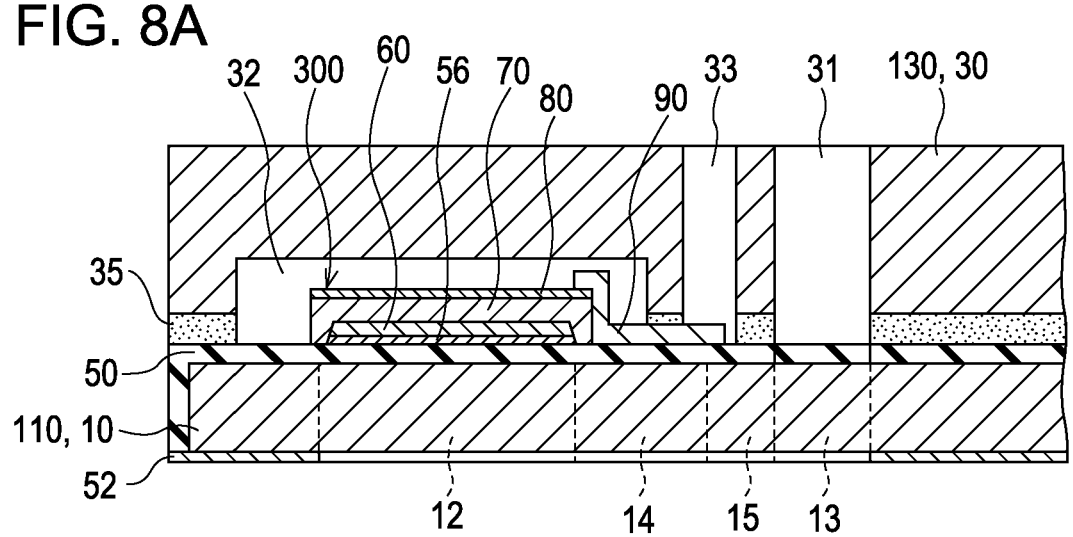
FIGS. 8A and 8B are cross sectional views illustrating manufacturing processes of the recording head according to Embodiment 1.

Next, as illustrated in FIG. 8A, a mask film 52 is newly formed on the flow path formation substrate wafer 110, and then patterned into a predetermined shape.

Figure 8B:
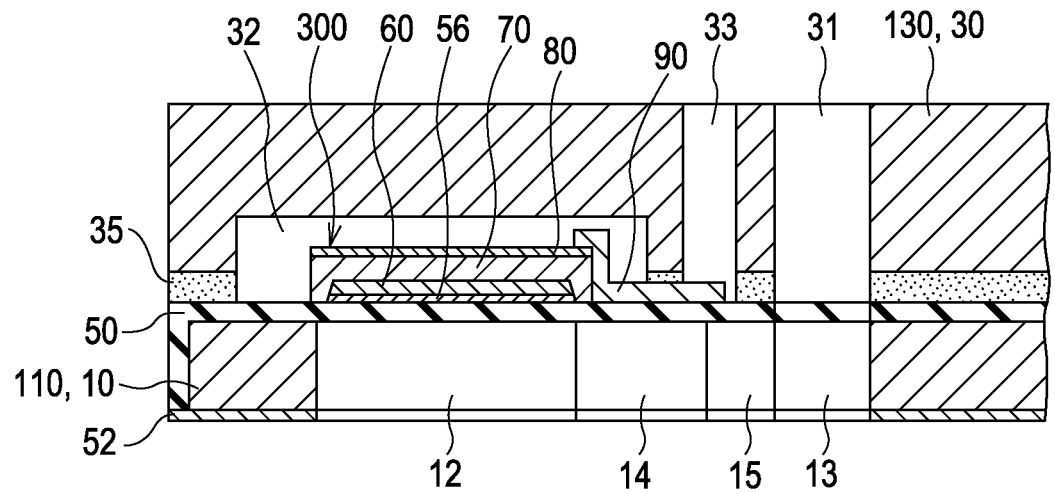
Figure 9A:
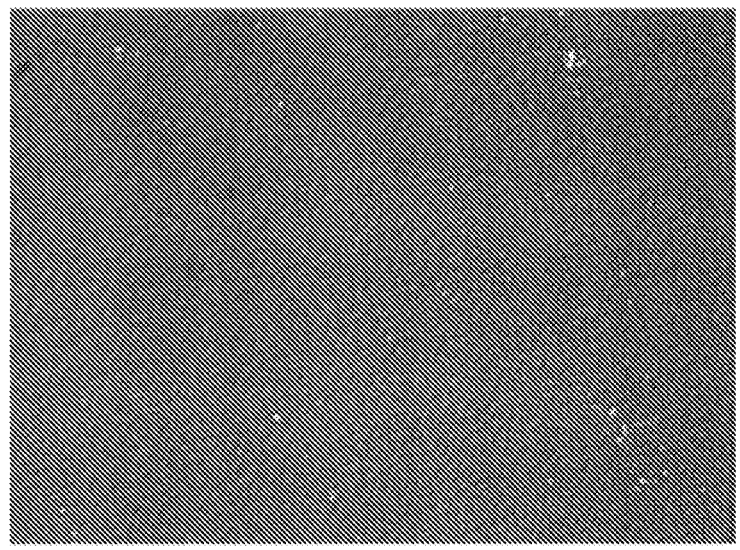
FIGS. 9A and 9B are photographs in which the surfaces of piezoelectric layers of Examples 1 and 2 are observed.
Figure 9B:
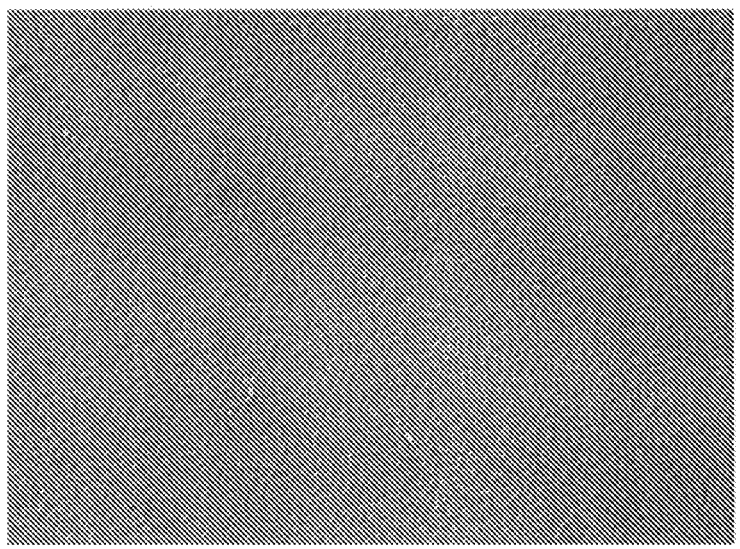
Figure 10A:
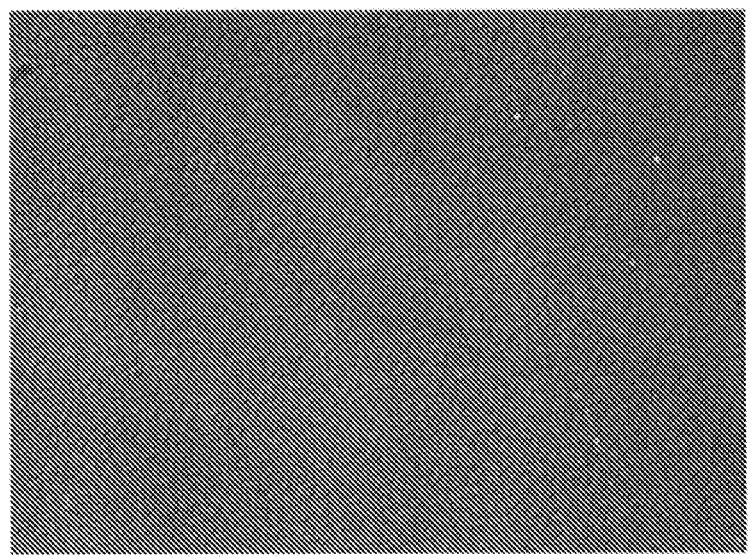
FIGS. 10A and 10B are photographs in which the surfaces of piezoelectric layers of Examples 3 and 4 are observed.
Figure 10B:
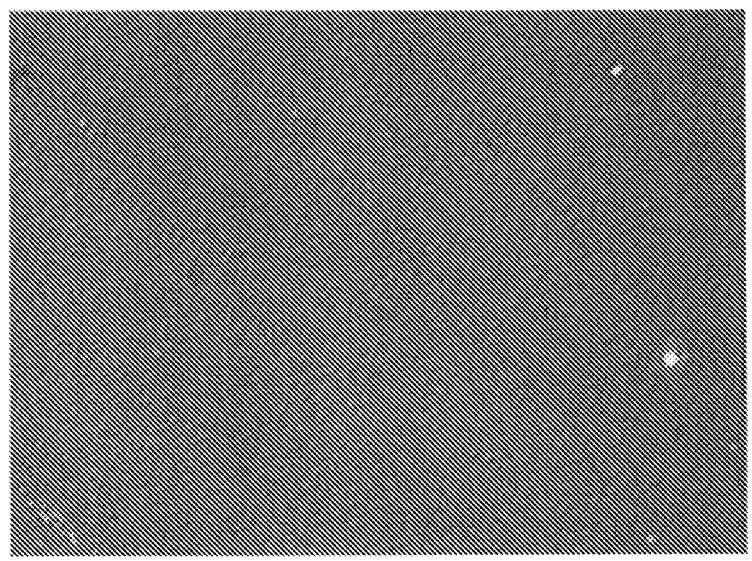
Figure 11A:
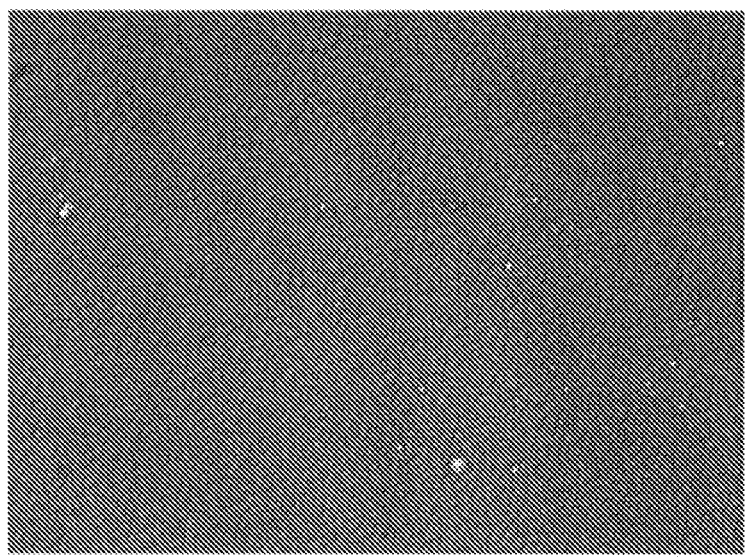
FIGS. 11A and 11B are photographs in which the surfaces of piezoelectric layers of Examples 5 and 6 are observed.
Figure 11B:
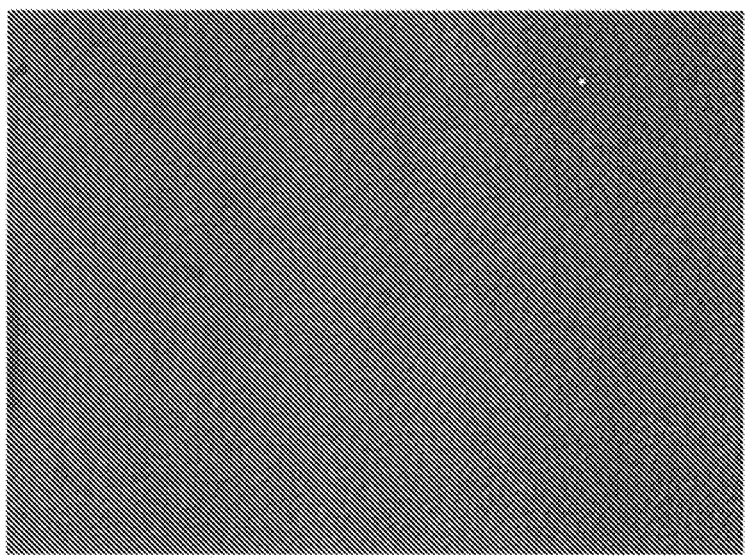
Figure 12:
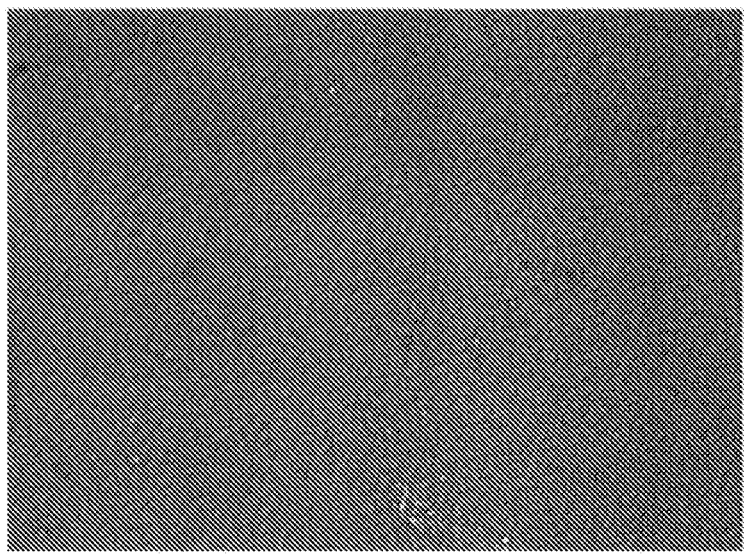
FIG. 12 is a photograph in which the surface of a piezoelectric layer of Example 7 is observed.

Then, as illustrated in FIG. 8B, by anisotropically etching (wet etching) the flow path formation substrate wafer 110 using an alkaline solution, such as KOH, through the mask film 52, the pressure generating chamber 12, the communication portion 13, the ink supply path 14, the communication path 15, and the like corresponding to the piezoelectric element 300 are formed.

Thereafter, unnecessary portions of the outer peripheral edge portion of the flow path formation substrate wafer 110 and the protective substrate wafer 130 are removed by cutting the same by dicing or the like, for example. Then, by bonding the nozzle plate 20 in which the nozzle openings 21 are opened after removing the mask film 52 at the surface opposite to the protective substrate wafer 130 of the flow path formation substrate wafer 110 and also bonding a compliance substrate 40 to the protective substrate wafer 130, and then dividing the flow path formation substrate wafer 110 and the like into the flow path formation substrate 10 and the like of one chip size as illustrated in FIG. 1, the ink jet recording head I of this embodiment is obtained.

EXAMPLES

Hereinafter, the invention is further specifically described with reference to Examples below. The invention is not limited to Examples below. Table 1 shows the composition and the firing conditions of buffer layers and the concentration of buffer layer precursor solutions of Examples and Comparative Examples.

TABLE 1

| | Buffer layer production conditions | | | | | | | |
|---|---|---|---|---|---|---|---|---|
| | Composition (%) | | | | | Firing temperature (° C.) | Temperature increase rate (° C./sec) | Concentration (mol/l) Based on atoms in A site |
| | Bi | Fe | Zn | Ni | Ti | | | |
| Ex. 1 | 50 | 42.5 | 3.75 | — | 3.75 | 650 | 300 | 0.25 |
| Ex. 2 | 50 | 42.5 | 3.75 | — | 3.75 | 650 | 1 | 0.25 |
| Ex. 3 | 50 | 42.5 | 3.75 | — | 3.75 | 650 | 300 | 0.125 |
| Ex. 4 | 50 | 46.5 | — | 1.75 | 1.75 | 650 | 300 | 0.25 |
| Ex. 5 | 50 | 46.5 | — | 1.75 | 1.75 | 750 | 400 | 0.25 |
| Ex. 6 | 50 | 48 | — | 2 | — | 750 | 400 | 0.25 |
| Ex. 7 | 49 | 49 | — | 2 | — | 750 | 400 | 0.25 |
| Comp. Ex. 1 | — | — | — | — | — | 650 | 400 | 0.25 |
| Comp. Ex. 2 | — | — | — | — | — | 750 | 2 | 0.25 |

Example 1

First, a silicon oxide ($SiO_2$) film having a film thickness of 1200 nm was formed by thermal oxidation on the surface of a (100) single crystal silicon (Si) substrate. Next, a titanium film having a film thickness of 40 nm was formed on the $SiO_2$ film by an RF magnetron sputtering method, and then thermally oxidized, thereby forming a titanium oxide film. Next, a platinum film (first electrode 60) which was oriented in the (111) plane and had a thickness of 100 nm was formed on the titanium oxide by an RF magnetron sputtering method.

Next, the buffer layer 72 of a perovskite structure containing bismuth, iron, zinc, and titanium was formed on the first electrode 60. The technique is as follows. First, n-octane solutions of bismuth 2-ethylhexanoate, iron 2-ethylhexanoate, zinc 2-ethylhexanoate, and titanium 2-ethylhexanoate, were mixed in such a manner as to achieve a molar ratio of Bi:Fe:Zn:Ti=10:85:7.5:7.5 to thereby prepare a precursor solution of the buffer layer 72.

Subsequently, the precursor solution of the buffer layer 72 was added dropwise on the substrate on which the titanium oxide film and the platinum film were formed, and then the substrate was rotated at 3000 rpm, thereby forming the buffer layer precursor film 71 by a spin coating method (buffer layer application process). Next, the buffer layer precursor film 71 was dried for 2 minutes at 180° C. on a hot plate (buffer layer drying process). Subsequently, degreasing was performed for 2 minutes at 350° C. (buffer layer degreasing process). Thereafter, the temperature was increased to 650° C. at 300° C./second, and then firing was performed at 650° C. for 2 minutes in an oxygen environment in a Rapid Thermal Annealing (RTA) apparatus, thereby forming the buffer layer 72 containing a mixed crystal of bismuth manganite and bismuth ferrate (buffer layer firing process).

Subsequently, the complex oxide layer 74 was formed on the buffer layer 72. The technique is as follows. First, n-octane solutions of bismuth 2-ethylhexanoate, iron 2-ethylhexanoate, manganese 2-ethylhexanoate, barium 2-ethylhexanoate, and titanium 2-ethylhexanoate, were mixed in such a manner that the ratio of each element achieved Bi:Ba:Fe:Ti:Mn=75:25:71.25:25:3.75 in terms of molar ratio to thereby prepare a precursor solution.

Then, the precursor solution was added dropwise onto the buffer layer 72, and the substrate was rotated at 3000 rpm, thereby forming the complex oxide layer precursor film 73 (application process). Next, the complex oxide layer precursor film 73 was dried on a hot plate at 180° C. for 2 minutes (drying process). Subsequently, degreasing was performed at 350° C. for 2 minutes (degreasing process). Thereafter, the temperature was increased to 750° C. at 400° C./second, firing was performed at 750° C. for 2 minutes in an RTA apparatus in an oxygen environment for crystallization, thereby forming the complex oxide layer 74 containing a complex oxide containing Bi, Fe, Ba, and Ti and having a perovskite structure (firing process). Then, the application process, the drying process, and the degreasing process of the complex oxide layer precursor film 73 were repeated twice, the firing process was performed, and the sequence of operations from the application to the firing was repeated four times, thereby forming the piezoelectric layer 70 having a thickness of 700 nm and containing the buffer layer 72 and the complex oxide layer 74.

Example 2

The same operation as that in Example 1 was performed, except increasing the temperature to 650° C. at 1° C./second and performing firing at 650° C. for 2 minutes in an RTA apparatus in an oxygen environment as the firing conditions of the buffer layer precursor film.

Example 3

The same operation as that in Example 1 was performed, except reducing by half the concentration of the precursor solution forming the buffer layer precursor film.

Example 4

The same operation as that in Example 1 was performed, except using, as the precursor solution of the buffer layer, a mixture in which n-octane solutions of bismuth 2-ethylhexanoate, iron 2-ethylhexanoate, nickel 2-ethylhexanoate, and titanium 2-ethylhexanoate were mixed in such a manner as to achieve a molar concentration ratio of Bi:Fe:Ni:Ti=100:93:0.35:0:35.

Example 5

The same operation as that in Example 1 was performed, except increasing the temperature to 750° C. at 400° C./second and performing firing at 750° C. for 2 minutes in an RTA apparatus in an oxygen environment as the firing conditions of the buffer layer precursor film.

Example 6

The same operation as that in Example 1 was performed, except using, as the precursor solution of the buffer layer, a mixture in which n-octane solutions of bismuth 2-ethylhexanoate, iron 2-ethylhexanoate, nickel 2-ethylhexanoate, and titanium 2-ethylhexanoate were mixed in such a manner as to achieve a molar concentration ratio of Bi:Fe:Ni=100:96:4 and increasing the temperature to 750° C. at 400° C./second and performing firing at 750° C. for 2 minutes in an RTA apparatus in an oxygen environment as the firing conditions of the buffer layer precursor film.

Example 7

The same operation as that in Example 1 was performed, except using, as the precursor solution of the buffer layer, a mixture in which n-octane solutions of bismuth 2-ethylhexanoate, iron 2-ethylhexanoate, nickel 2-ethylhexanoate, and titanium 2-ethylhexanoate were mixed in such a manner as to achieve a molar concentration ratio of Bi:Fe:Ni=98:98:4 and increasing the temperature to 750° C. at 2° C./second and performing firing at 750° C. for 2 minutes in an RTA apparatus in an oxygen environment as the firing conditions of the buffer layer precursor film.

Comparative Example 1

The same operation as that in Example 1 was performed, except not forming the buffer layer, using a precursor solution having the same composition as that of the complex oxide layer in place of the precursor solution of the buffer layer, and increasing the temperature to 750° C. at 400° C./second and performing firing at 750° C. for 2 minutes in an RTA apparatus in an oxygen environment as the firing conditions.

Comparative Example 2

The same operation as that in Example 1 was performed, except not forming the buffer layer, using a precursor solution having the same composition as that of the complex oxide layer in place of the precursor solution of the buffer layer, and increasing the temperature to 750° C. at 2° C./second and performing firing at 750° C. for 2 minutes in an RTA apparatus in an oxygen environment as the firing conditions.

Test Example 1

In Examples 1 to 7 and Comparative Examples 1 to 2, the piezoelectric layers 70 in a state where the second electrodes 80 were not formed were observed for the surface immediately after the formation under a metallurgical microscope at a magnification of 100. The results are shown in FIGS. 9 to 13.

Figure 13A:
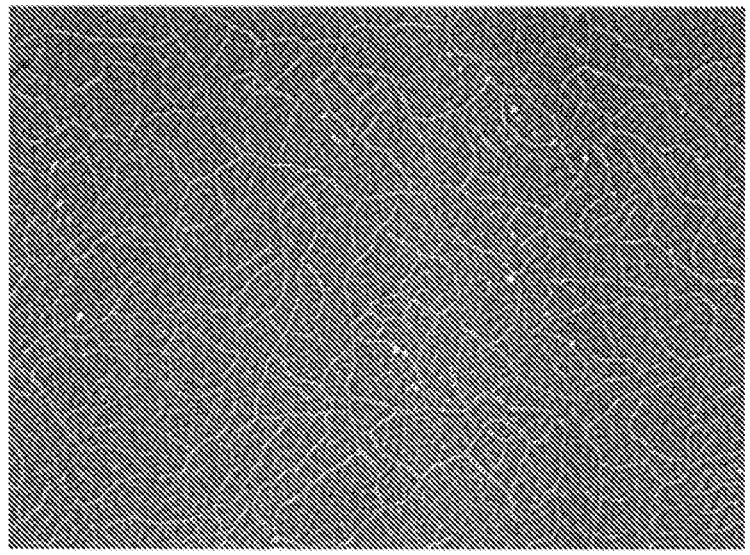
FIGS. 13A and 13B are photographs in which the surfaces of piezoelectric layers of Comparative Examples 1 and 2 are observed.
Figure 13B:
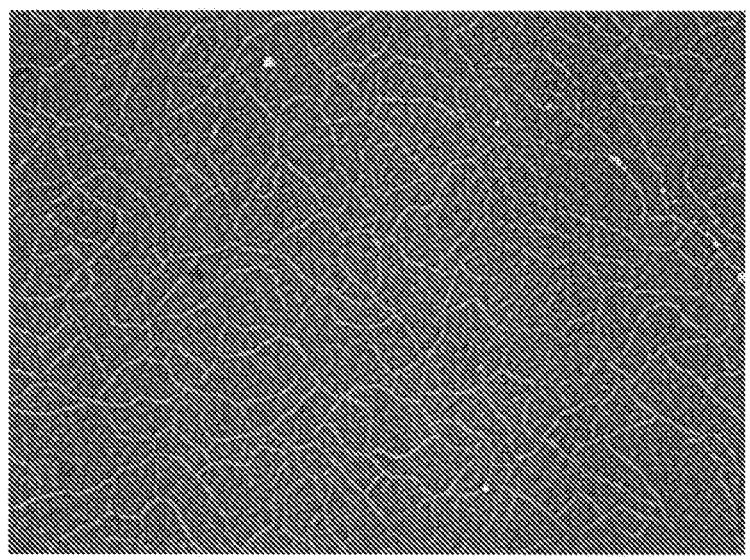

The results showed that, cracking did not occur in Examples 1 to 7 as illustrated in FIGS. 9 to 12 but cracking occurred in many portions in Comparative Examples 1 and 2 as illustrated in FIG. 13. Moreover, as a result of observing the same after the passage of 65 hours, it was confirmed that cracking did not occur in Examples 1 to 8 in which the buffer layer was provided.

Other Embodiments

As described above, one embodiment of the invention is described but the fundamental configuration of the invention is not limited to the configuration described above. For example, the silicon single crystal substrate is mentioned as an example of the flow path formation substrate 10 in the embodiment described above. However, the invention is not particularly limited thereto and materials, such as an SOI substrate and glass, may be used, for example.

Furthermore, the piezoelectric element 300 in which the first electrode 60, the piezoelectric layer 70, and the second electrode 80 were successively laminated on the substrate (flow path formation substrate 10) is described as an example in the embodiment described above. However, the invention is not particularly limited thereto, and the invention is also applicable to a vertical vibration type piezoelectric element in which piezoelectric materials and electrode formation materials are alternately laminated so as to be elongated or contracted in the axial direction.

Figure 14:
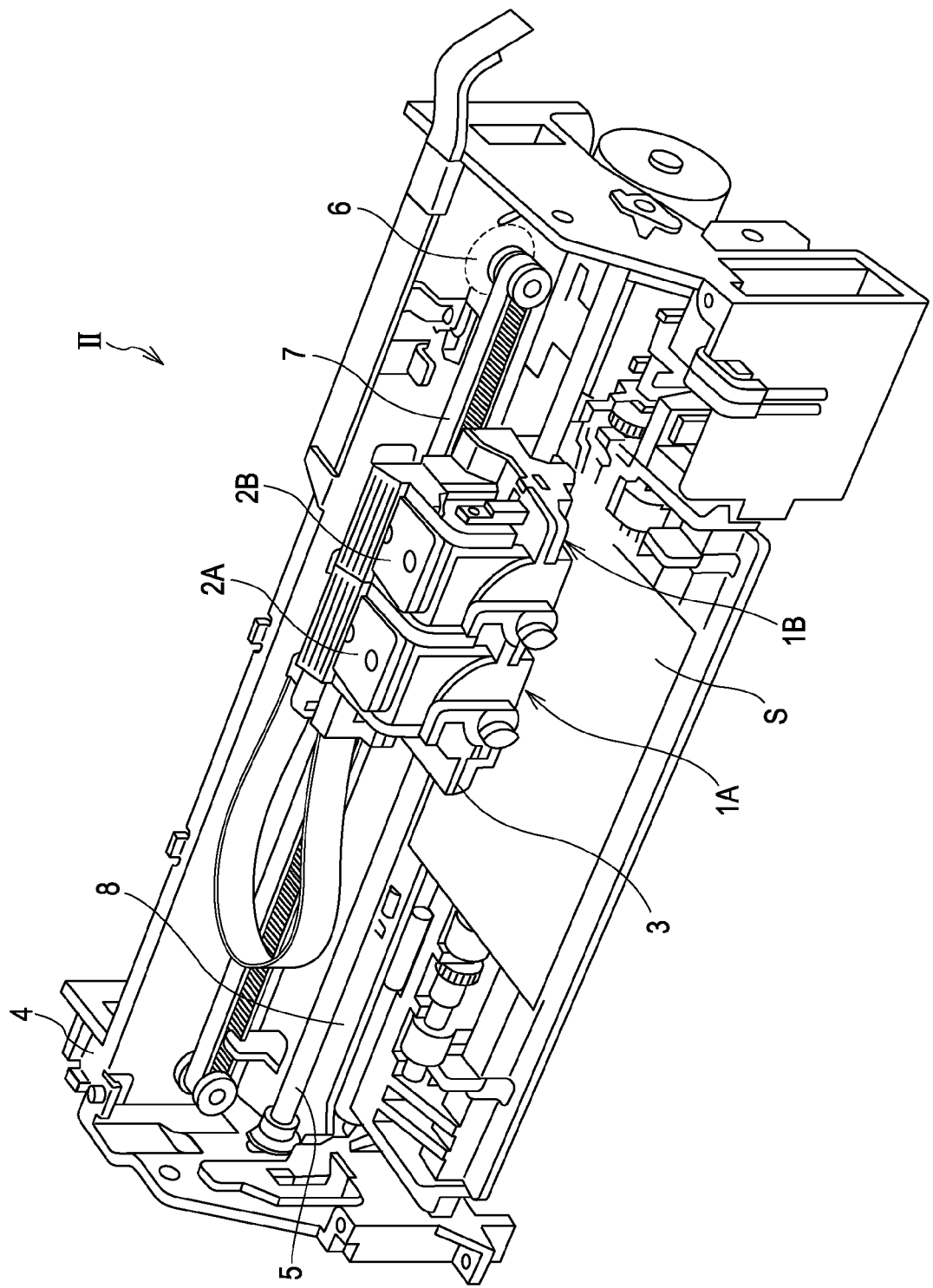
FIG. 14 is a view illustrating the schematic configuration of a recording apparatus according to one embodiment of the invention.

The ink jet recording heads of these embodiments each constitute a part of a recording head unit having an ink flow path communicating with an ink cartridge or the like and is mounted in an ink jet recording apparatus. FIG. 14 is a schematic diagram illustrating an example of the ink jet recording apparatus.

In an ink jet recording apparatus II illustrated in FIG. 14, cartridges 2A and 2B constituting an ink supply unit are detachably provided in recording head units 1A and 1B having the ink jet recording head I, and a carriage 3 in which the recording head units 1A and 1B are mounted is provided on a carriage shaft 5 attached to an apparatus body 4 in such a manner as to be movable in the axial direction. The recording head units 1A and 1B discharge, for example, a black ink composition and a color ink composition, respectively.

As a driving force of a driving motor 6 is transmitted to the carriage 3 via a plurality of gears (not illustrated) and a timing belt 7, the carriage 3 in which the recording head units 1A and 1B are mounted is moved along the carriage shaft 5. On the other hand, a platen 8 is provided in the apparatus body 4 along the carriage shaft 5, and a recording sheet S which is a recording medium, such as paper, fed by a feed roller (not illustrated) is wound around the platen 8 to be transported.

In the embodiments described above, the ink jet recording head is described as an example of liquid ejecting heads. However, the invention is widely applied to general liquid ejecting heads, and it is a matter of course that the invention can also be applied to liquid ejecting heads that eject liquid other than ink. Mentioned as the other liquid ejecting heads are, for example, various recording heads for use in an image recording apparatus, such as a printer, a color material ejecting head used for manufacturing a color filter of a liquid crystal display or the like, an electrode material ejecting head used for forming electrodes of an organic EL display, a field emission display (FED), and the like, and a biological organic material ejecting head used for manufacturing biochips.

Moreover, the piezoelectric element according to an aspect of the invention is not limited to piezoelectric elements for use in liquid ejecting heads and can also be used for other devices. Mentioned as the other devices are, for example, ultrasonic devices, such as an ultrasonic transmitter, an ultrasonic motor, a temperature-electricity converter, a pressure-electricity converter, a ferroelectric transistor, a piezoelectric transformer, filters, such as a blocking filter for blocking harmful rays, such as infrared rays, an optical filter utilizing the photonic crystal effect by quantum dot formation, and an optical filter utilizing an optical interference of a thin film, and the like. Moreover, the invention is applicable also to a piezoelectric element to be used as a sensor and a piezoelectric element to be used as a ferroelectric memory. Mentioned as sensors to which the piezoelectric element is applied are, for example, an infrared sensor, an ultrasonic sensor, a thermal sensor, a pressure sensor, a pyroelectric sensor, a gyro sensor (angular velocity sensor), and the like.

What is claimed is:
1. A liquid ejecting head, comprising:
a piezoelectric element having a piezoelectric layer and a first electrode and a second electrode provided on the piezoelectric layer, the piezoelectric layer containing:
  a buffer layer provided on the first electrode and having a perovskite structure containing bismuth, iron, and at least one of zinc and nickel; and
  a complex oxide layer provided on the buffer layer and having a perovskite structure containing bismuth, iron, barium, and titanium.

2. The liquid ejecting head according to claim 1, wherein the buffer layer further contains titanium.

3. A liquid ejecting apparatus, comprising the liquid ejecting head according to claim 1.

4. A liquid ejecting apparatus, comprising the liquid ejecting head according to claim 2.

5. A piezoelectric element, comprising:
  a piezoelectric layer; and
  a first electrode and a second electrode provided on the piezoelectric layer,
  the piezoelectric layer containing:
    a buffer layer provided on the first electrode and having a perovskite structure containing bismuth, iron, and at least one of zinc and nickel; and
    a complex oxide layer provided on the buffer layer and having a perovskite structure containing bismuth, iron, barium, and titanium.

6. A method for manufacturing a piezoelectric element provided with a piezoelectric layer and a first electrode and a second electrode provided on the piezoelectric layer, the method comprising:
  forming a buffer layer having a perovskite structure containing bismuth, iron, and at least one of zinc and nickel on the first electrode; and
  forming a complex oxide layer having a perovskite structure containing bismuth, iron, barium, and titanium on the buffer layer.

* * * * *